U S008063629B2

United States Patent
Hackner et al.

(10) Patent No.: US 8,063,629 B2
(45) Date of Patent: Nov. 22, 2011

(54) METHOD FOR PROCESSING SENSOR SIGNALS SUBJECT TO AN OFFSET AND SENSOR ARRANGEMENT DESIGNED TO CARRY OUT THE METHOD

(75) Inventors: Michael Hackner, Hemau (DE); Hans-Peter Hohe, Heiligenstadt (DE)

(73) Assignee: Fraunhofer-Gesellschaft zur Forderung der angewandten Forschung e.V. (DE)

( * ) Notice: Subject to any disclaimer, the term of this patent is extended or adjusted under 35 U.S.C. 154(b) by 436 days.

(21) Appl. No.: 12/305,425

(22) PCT Filed: Jun. 29, 2007

(86) PCT No.: PCT/DE2007/001157
§ 371 (c)(1),
(2), (4) Date: Dec. 18, 2008

(87) PCT Pub. No.: WO2008/006337
PCT Pub. Date: Jan. 17, 2008

(65) Prior Publication Data
US 2009/0315549 A1    Dec. 24, 2009

(30) Foreign Application Priority Data

Jul. 14, 2006  (DE) .......................... 10 2006 032 760
Dec. 15, 2006  (DE) .......................... 10 2006 059 421

(51) Int. Cl.
*G01B 7/30* (2006.01)

(52) U.S. Cl. ................................. 324/207.25
(58) Field of Classification Search .................. None
See application file for complete search history.

(56) References Cited

U.S. PATENT DOCUMENTS
6,674,322 B2    1/2004    Motz ............................ 330/9

FOREIGN PATENT DOCUMENTS
EP        1 637 898 A1    9/2004

OTHER PUBLICATIONS

*A CMOS Nested-Chopper Instrumentation Amplifier with 100-nV Offset*; Bakker et al., IEEE Journal of Solid-State Circuits, vol. 35, No. 12, Dec. 2000.

*Primary Examiner* — Roberto Velez
(74) *Attorney, Agent, or Firm* — Renner Kenner Greive Bobak Taylor & Weber

(57) ABSTRACT

In a method and a sensor arrangement for processing sensor signals of a sensor, which is operated in a plurality of measurement cycles with successive phases with different driving, before the amplification, the sensor signals of n phases of each measurement cycle are weighted with negative mathematical sign and the sensor signals of the remaining n phases of the measurement cycle are weighted with positive mathematical sign by a modulation. Before the amplification, an offset averaged from the sensor signals of the two phases is subtracted from the sensor signals of each two of the phases which were weighted with different mathematical sign and have an offset of the same mathematical sign after the modulation. The artificially generated offset is eliminated again by a demodulation after the amplifier and a summation over the digitized signals of each measurement cycle.

8 Claims, 6 Drawing Sheets

METHOD FOR PROCESSING SENSOR SIGNALS SUBJECT TO AN OFFSET AND SENSOR ARRANGEMENT DESIGNED TO CARRY OUT THE METHOD

TECHNICAL AREA

The present invention relates to a method for processing sensor signals, which are subject to an offset, from a sensor, which is operated in a plurality of measurement cycles each having 2n (n=1, 2, . . . ) successive phases with different driving, in which the sensor signals of the individual phases are amplified in an amplifier and subsequently digitized using an analog/digital converter, and in which the amplified digitized signals of individual phases of each measurement cycle are summed to obtain an offset-reduced output signal for each measurement cycle, the sensor signals being modulated in a modulator before the amplification and demodulated again in a demodulator after the amplification. The invention also relates to a sensor arrangement which is designed to carry out the method.

In nearly all sensor applications, an offset of the sensor signal occurs, which may be caused both by the production and also by other external influences. A reduction or compensation of this offset is of great significance for increasing the measurement precision. A known technology for offset compensation, which is used above all in Hall sensors, is the so-called spinning current technology. A requirement for a good offset suppression using this technology is an at least 4-fold rotational symmetry of the Hall element. The length and width of the element must be equal for this purpose and the contacts for applying the control current $I_0$ and/or the control voltage $U_0$ and tapping the Hall voltage $U_H = U_{H+} - U_{H-}$ must be constructed identically. In Hall elements having four contacts, the control current may then be applied in four different directions and the Hall voltage may be tapped perpendicularly thereto. This is shown on the basis of the schematic illustration of the four so-called spinning current phases of FIG. 1, in each of which the equivalent circuit diagram of asymmetrical Hall element having four contacts is shown. A measurement cycle comprises the four phases shown, which differ through the different driving of the Hall element. If the measurement results of these four spinning current phases of each measurement cycle are summed, the offset is reduced in relationship to the signal by approximately a factor of 100 to 1000.

In addition to the usage of four different phases, spinning current technologies are also known in which the Hall sensors are driven in eight phases. This requires correspondingly implemented Hall elements having 8-fold rotational symmetry and eight contacts, the control current and the Hall voltage then not being rotated by 90° in each case from phase to phase as in the case of the 4-phase mode of operation, but rather by 45°. In principle, arbitrary rotation angles are possible, however, only rotation angles of $360°/(4*n)$ being advisable to reduce the offset (n=1, 2, . . . ).

To carry out the spinning current method, it is first necessary to measure the individual Hall components, which contain the particular single phase offset and the magnetic signal travel for each phase. However, the single phase offset is typically very large in comparison to the magnetic signal travel, i.e., the desired measured variable. This is shown as an example by the measurement of FIG. 2, in which the normalized magnetic field is plotted on the right and the output voltage of the Hall element after digitization is plotted on top. The dashed lines correspond to the digitized voltage between the Hall contacts in the particular spinning current phase P0-P3 in digits of the analog/digital converter (ADU) used. The solid line represents the mean value of these four voltages scaled by the factor 10. This thus corresponds to the result after the summation over the four phases, i.e., the offset-corrected measurement result upon use of the spinning current technology. As is obvious from FIG. 2, in this measurement the single phase offset is greater than the magnetic signal travel. The ADU is accordingly primarily controlled by the offset of the individual phases. Because an overload must be avoided, the amplification of the amplifier typically used between the sensor and the ADU may not be adapted to the magnetically induced output signal of the sensor. It must be selected in consideration of the single phase offset. The resolution of the analog/digital conversion is thus predominantly limited by the single phase offset and not by the signal travel. This reduces the resolution and thus the measurement precision.

If amplifiers are used for further processing of the sensor signal, an additional offset is frequently added in the signal path by these amplifiers, which is added to the individual phases. Because the offsets of the Hall elements and the amplifier are distributed in a stochastic, typically Gaussian, way over all manufactured systems, the expected value of the total offset also does not increase linearly. Rather, it is calculated by the calculation of the root-mean square of the two effective values. Nonetheless, an increase of the expected value of the total offset occurs due to the amplifier, whereby the resolution of the magnetic signal is further reduced by the ADU.

Various methods are known for correcting the offset of the amplifier. The most important of these methods are offset calibration or trimming, so-called auto zero or correlated double sampling (CDS), and the chopper method.

While a drift of the offset after the trimming may not be prevented by the offset calibration, offsets of this type may also be compensated for or at least decreased using the auto zero and chopper methods. In the chopper method, the input signal is modulated before the amplifier and demodulated again after the amplifier. In the simplest case, the modulator is implemented via switches for symmetrical signals, so that the input signal is switched to the input of amplifier inverted once and not inverted once. The signal processing at the output is performed equivalently, so that the signal is transmitted unchanged. The amplifier offset and the 1/f noise may be strongly reduced, however, because they are modulated up to the chopper frequency and its multiple. The following low-pass filter (LPF) removes these components.

In the event of small input signals, whose amplitude is significantly less than the input-related offset of the amplifier without chopper, the maximum possible amplification is also already limited here by the intrinsic offset of the amplifier, however. This is explained on the basis of FIGS. 3 through 5. For this purpose, FIG. 3 shows the modulation of the input signal $V_{in}$ using the modulator 1, the amplifier 2, the demodulator 3 for demodulating the amplified signal, and the downstream low-pass filter 4, using which the components of the amplifier offset and the 1/f noise are eliminated. The offset of the amplifier 2 is indicated in this case by the offset source 5. In the present example, a sinusoidal input signal of 0.1 mV amplitude without offset is assumed. The internal amplifier 2 subject to offset is modulated by an offset-free amplifier and an input-equivalent offset voltage source. A signal $V_{inMod}$, which has the input signal $V_{in}$ as the envelope, and is rectangularly modulated via rect(t), is produced from the input signal $V_{in}$ (without offset). As may be seen in the diagram of FIG. 4, the input control is dominated by the offset. The offset also predominates over the useful signal component at the output of the amplifier 2, as may be seen in FIG. 5. It is obvious that the control range before the low-pass filter 4 must be 11 times higher because of the offset than it would have to be because of the useful signal. A sliding mean value filter was used as the low-pass filter, whose integration interval corresponds to exactly one period of the modulation signal rect(t).

A disadvantage of compensation using switches, as in the chopper method, is an additional offset component which arises due to charge injection in the switches. The actual offset of the amplifier is significantly reduced, but additional charge is injected into the signal paths, which is expressed as additional offset, by parasitic capacitances of the switches. Using a second chopper configuration having a chopper amplifier, which is driven at lower frequency to thus also eliminate the offset caused by charge injection, is known for counteracting this effect. This is explained in greater detail, for example, in A. Bakker et al., "A CMOS Nested-Chopper Instrumentation Amplifier with 100 nV Offset", IEEE Journal of Solid-State Circuits, Volume 35, Number 12, December 2000, pages 1877 to 1883.

In these and the other known methods for reducing the amplifier offset, only the offset of the amplifier itself is reduced or eliminated. Offset components which arise in the signal source before the amplifier are not affected. They are effectively reduced in case of the Hall sensors by the spinning current method. However, in spite of this already significant reduction of the offset, the desire exists for a further increase of the measurement precision for Hall elements in particular.

The object of the present invention therefore comprises, for sensors which are operated in a plurality of measurement cycles having a plurality of successive phases with different driving, specifying a method for processing the sensor signals which allows a further increase of the measurement precision. Furthermore, a sensor arrangement is to be provided which allows the method to be carried out.

DESCRIPTION OF THE INVENTION

The object is achieved by the method and the sensor arrangement according to claims 1 and 5. Advantageous embodiments of the method and the sensor arrangement are the subject matter of the subclaims or may be inferred from the following description and the exemplary embodiments.

In the suggested method for processing sensor signals, which are subject to an offset, from a sensor which is operated in a plurality of measurement cycles each having 2n (n=1, 2, . . . ) successive phases with different driving, the sensor signals of the individual phases are amplified in an amplifier and subsequently digitized using an analog/digital converter in a known way. The amplified and digitized signals of the individual phases of each measurement cycle are summed to obtain an offset-reduced output signal for each measurement cycle. In the present method, the sensor signals are modulated before the amplification in a modulator in such a way that the sensor signals of n phases of each measurement cycle are weighted with negative mathematical sign and the sensor signals of the remaining n phases of the measurement cycle are weighted with positive mathematical sign. For this purpose, an offset averaged from the sensor signals of each two phases which were weighted with different mathematical sign and have an offset of identical mathematical sign after the modulation, is subtracted from the modulated sensor signals of the two phases before the amplification. In a demodulator after the amplifier, a demodulation of the modulated signals is subsequently performed again, in which the signals of the individual phases are combined again with the correct mathematical sign. The offset of the amplifier may also be reduced in this method by filtering preferably performed after the demodulation or in the demodulator. With low-pass filtering of this type, the signal components which are modulated with the modulation frequency or a higher frequency are blocked in a known way.

In the design of the present method, it was recognized that the measurement precision during a multiphase operation of a sensor of this type may be increased if not only the total offset of the signal processing chain between the sensor and the output of the sensor arrangement, but rather also the sensor signals of the individual phases are reduced in offset separately from one another. With the method, the sensor signals already arriving at the amplifier are reduced in offset, so that the amplification is no longer limited by the frequently greater offset, but rather the measurement signal may be adapted significantly better. By the thus improved ability to exploit the control range of the amplifier, small measurement signals may also be optimally processed further. For this purpose, the offset of the sensor signals does not even have to be ideally compensated once. The remaining intrinsic offset must only be significantly less than the maximum useful signal amplitude which is to be processed. Therefore, with the present method, not only is the offset of each component reduced per se, i.e., of the sensor with the spinning current method and of the amplifier with the chopper method. Rather, the total offset of the signal processing chain made of sensor and amplifier is reduced enough that its component on the control range of the following signal processing chain, in particular the analog/digital converter or an amplifier, is significantly reduced in comparison to the actual measurement signal, such as the magnetically induced signal travel in a Hall sensor. This results in better usage of the control range by the actual measurement signal and thus a higher resolution in the subsequent analog/digital conversion, which results in the higher precision.

The present patent application does not differentiate between amplifiers and preamplifiers. The amplifier may thus also be one or more preamplifiers.

The basic idea of the present method comprises artificially generating, in or before the amplifier, an additional offset which approximately compensates for the offset of the sensor signal of the particular phase of the measurement cycle.

In the ideal case, the compensation of the offset of the sensor would also already be achieved in this way, so that a multiphase operation would then no longer be necessary for this purpose. However, an offset compensation of this type is only possible in practice at precisely one temperature and one operating voltage, because the offset of the individual phases is not stable. In reality, the single phase offsets vary very strongly over the temperature and the operating voltage of the sensor. Furthermore, it also remains open whether an artificially generated offset of this type may be kept stable long enough as would be necessary for the compensation of the sensor offset during the operation of the sensor. In addition, the single phase offsets may change with time because of mechanical tensions in the sensor housing, for example. The artificially introduced offset typically has different temperature response than that of the sensor. Therefore, the offsets drift apart from one another again depending on the operating conditions, the correlation of the single phase offsets in multiphase operation, which is the cause of an improvement of the offset by the later summation, may not be simulated by the artificial offset of an amplifier. The output signal obtained at the output of the sensor arrangement would then have a higher probability of a greater offset than it would achieve without the additional offset correction only by application of the multiphase operation with later summation.

These problems were also recognized in the design of the present method and taken into consideration by a skillful selection of the additional offset compensation of the measurement signals of the individual phases. In this case, the single phase offsets were significantly reduced without losing their correlation to one another and/or introducing non-correlated offset components. On the one hand, the artificial offset subtracted from the measurement signals of the individual phases is determined in a special way in the suggested method. On the other hand, the measurement signals reduced by the same artificial offset are modulated in a special way in each case. This is explained hereafter on the basis of the example of a Hall sensor, which is operated in spinning current operation with four phases. Of course, however, the method may also be applied to Hall sensors, which have more than four terminals and may also be operated with more than four phases. Furthermore, the present method and also the associated sensor arrangement are not restricted to Hall sensors. Thus, the measurement precision of all sensors which are used in a comparable multiphase operation and in which the single phase offsets have a certain correlation may be improved with the method. Examples are bridge circuits made of individual sensor elements corresponding to the replacement circuit diagram for the Hall sensor element of FIG. 1.

It is known from measurements on Hall sensors that two spinning current phases always have a single phase offset having the same mathematical sign. In the present method, on the one hand, each two phases are weighted with different mathematical signs by the modulation, on the other hand, the mean offset of the two phases which have an offset of identical mathematical sign after the modulation is ascertained and applied to the (modulated) measurement signals of the two phases, i.e., subtracted from the measurement signals. The same procedure is selected for the two other phases, whose offset also has the same mathematical sign. The signal level of the measurement signals applied to the amplifier is significantly reduced in particular at larger offsets, as frequently occur in Hall elements, by this step. This allows a higher amplification of the actual useful signal in the amplifier. Furthermore, the remaining offset of the particular two phases around the zero point is balanced by this procedure. The control range of the analog/digital converter is thus exploited symmetrically on the one hand and may convert the measurement signals with higher precision because of the higher possible amplification on the other hand.

The correction value of the offset for the particular two phases does not have to have long-term stability and may also have a certain variation over the temperature and other operating parameters. This is harmless in the present method, because it is obtained weighted positive once and negative once after the demodulation as a result of the particular modulation of the measurement signals and is thus systematically eliminated from the total measurement value again upon the summation of the measurement signals of every measurement cycle. The artificially generated offset thus only plays a role in the range between the sensor and the demodulator and does not enter the result of the spinning current method. The already good result of the offset compensation with this method is therefore not worsened. On the other hand, however, the available control ranges of the amplifier and analog/digital converter are better exploited, so that a higher resolution may be achieved in the analog/digital conversion. This increases the measurement precision of the sensor arrangement.

In the present method, the demodulation of the modulated measurement signals preferably is first performed after the analog/digital conversion. This offers the advantage that the demodulation may be performed digitally, for example, using a decimation filter.

In a further preferred embodiment, the sensor arrangement is operated in the so-called nested chopper method, in which an additional modulator and demodulator are provided immediately before and after the amplifier. The modulation is performed in this case at a higher frequency than the modulation with the first modulator, to achieve a better suppression of the amplifier offset and the 1/f noise of the amplifier.

The suggested sensor arrangement for performing the method has the sensor with an activation unit, by which the sensor may be operated in the described multiphase operation. A modulator, which modulates the sensor signals according to the suggested method, is provided between the sensor and an amplifier for amplification. An offset source between the modulator and the amplifier is used for reduction of the sensor signals by the artificial offset determined according to the method, which is used for each two phases. An analog/digital converter and a demodulator after the amplifier are used for the digitization of the sensor signals and/or the demodulation of the modulated and amplified signals. In this case, the analog/digital converter is preferably situated between the amplifier and the demodulator, preferably a decimation filter. Furthermore, of course, additional components may also be used in this sensor arrangement for offset reduction, for example, an additional modulator and demodulator for operation of the sensor arrangement with a nested chopper method, as is known from the prior art.

BRIEF DESCRIPTION OF THE DRAWINGS

The suggested method and the associated sensor arrangement are explained in greater detail hereafter on the basis of exemplary embodiments in connection with the drawings. In the figures.

DETAILED DESCRIPTION OF THE EXEMPLARY EMBODIMENTS

Figure 1:
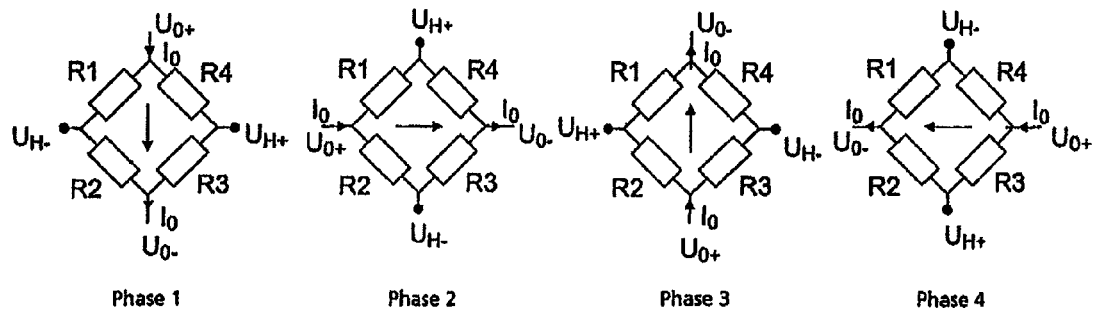
FIG. 1 shows a graph to illustrate the four phases in spinning current operation of a Hall sensor according to the Prior Art.

The present method and the associated sensor arrangement are explained in greater detail hereafter on the basis of examples, in which a Hall sensor having four contacts or terminals is operated with the spinning current technology with four phases per measurement cycle. An operation of this type and exemplary sensor signals of the different phases were already described in the introduction to the description in connection with FIGS. 1 and 2. These figures are therefore not discussed in greater detail at this point.

Figure 3:
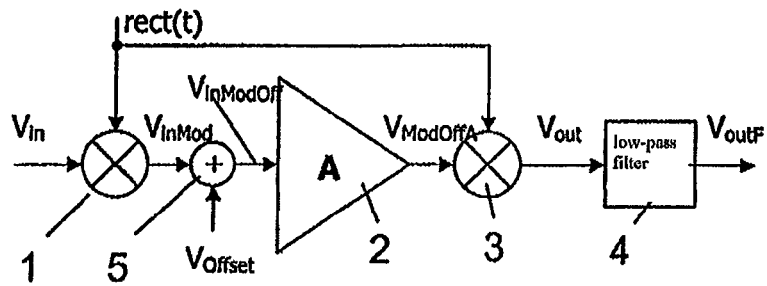
FIG. 3 shows an example of a chopper method according to the Prior Art.
Figure 4:
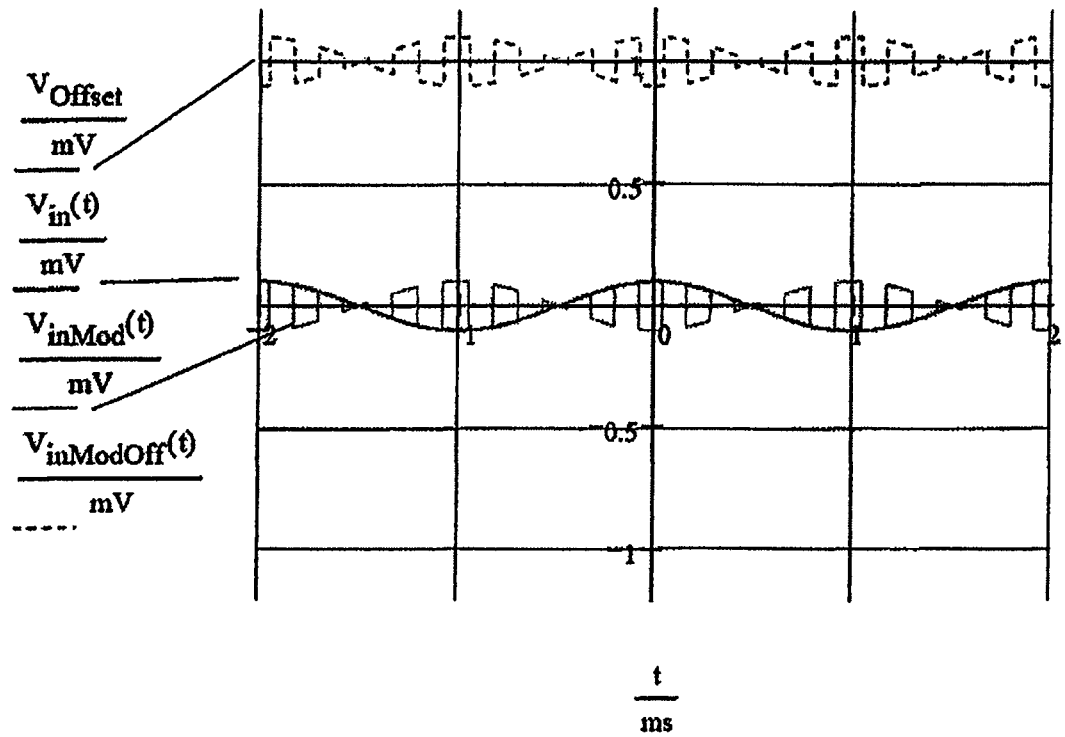
FIG. 4 shows an illustration of the signals obtained in the chopper method according to the Prior Art.
Figure 5:
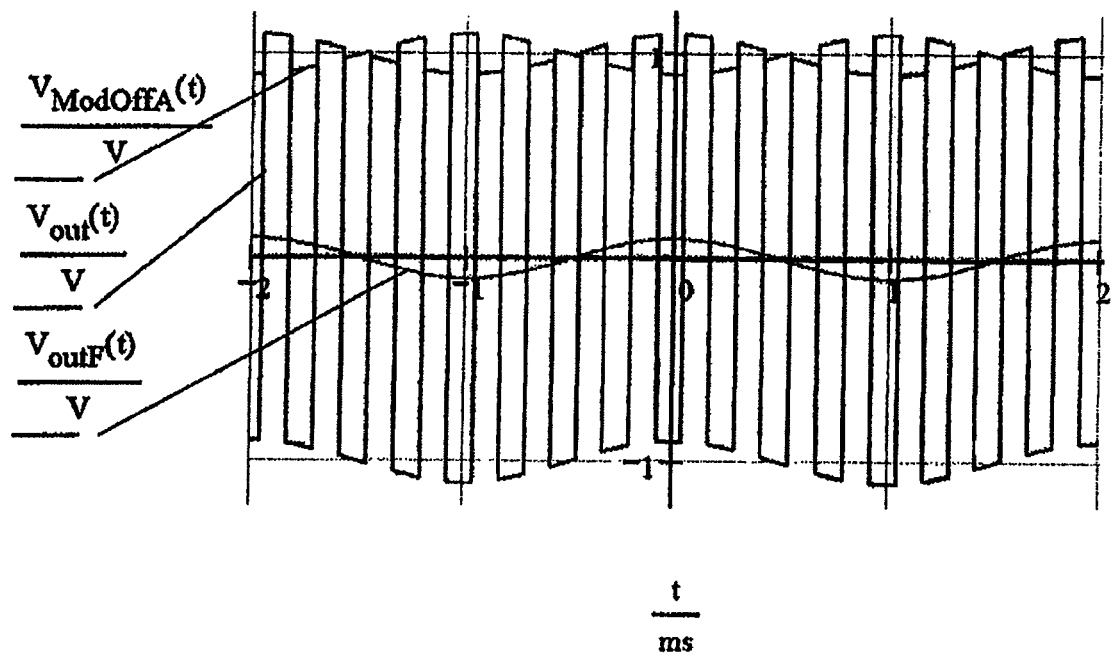
FIG. 5 shows an exemplary graph of the output signals of a chopper method according to the Prior Art.

This is also true for FIGS. 3 through 5, which illustrate the chopper method for offset reduction of the sensor signals of a sensor and the poor exploitation of the control range of the amplifier thus occurring.

All methods known until now for reducing the amplifier offset share the feature that only the offset of the amplifier itself is reduced or eliminated. Offset components which arise in the signal source before the amplifier are not affected by this measure. The offset of Hall elements may be significantly reduced by applying the spinning current method. However, the sensor signals of all spinning current phases including the offset of the individual phases must also first be amplified and digitized for this purpose. For this purpose, the offset of the particular individual phase together with the offset of the amplifier reduces the maximum possible amplification factor of the amplifier. Its output range or the input range of the downstream signal processing block, such as further amplifier stages or an analog/digital converter, only allows limited signal amplitude, which is already largely occupied by offsets in Hall sensor systems because of the relatively low sensitivity of the sensors.

In contrast, in the present method the total offset of the signal processing chain made of Hall sensor and amplifier is reduced enough that its component on the control range of the following signal processing chain (amplifier and/or ADU) is significantly reduced in comparison to the magnetically induced signal travel (useful signal). This component is currently typically between approximately 60% and 80%. This means that the signal component is only 20% to 40%. A component of the offset of at most 50% of the control range would be desirable, so that the signal component would rise to greater than 50%. The magnetic signal travel would then itself represent the determining variable for the dimensioning of the amplification and no longer the offset. However, on the other hand, this cannot result in the offset of the output signal being worsened after application of the spinning current summation.

Figure 6:
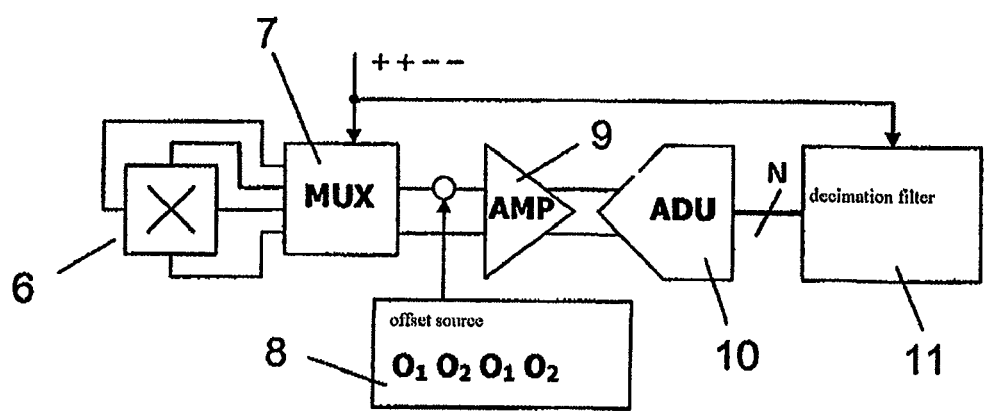
FIG. 6 shows an example of the suggested sensor arrangement and the associated method.

This is achieved in the following example in that the signal processing chain is supplemented by an offset voltage source 8, as schematically shown in FIG. 6. The sensor signals of the different phases of a measurement cycle of the Hall sensor 6 are modulated for this purpose in a modulator 7 in a specific way. A predetermined artificial offset $O_1$, $O_2$ is subsequently subtracted from the modulated signals via the offset source 8. The sensor signals corrected in this way are amplified in the amplifier 9 and subsequently digitized in analog/digital converter 10 (ADU).

During demodulation, two of the four phases are weighted positively and two phases are weighted negatively by the modulator 7. This mathematical sign change of the amplifier input signal is taken into consideration during the decimation in the decimation filter 11 after the amplifier as the mathematical sign, so that the correct signal again exists in the decimation filter 11 at the end of all four phases. Because of the changing mathematical sign with which the sensor signal is fed into the signal processing chain, the additional artificial offset—precisely like the intrinsic offset of the amplifier and the ADU—is again eliminated by the chopper method in the end result of the summation over all spinning current phases. This functions independently of temperature and other operating conditions.

Figure 2:
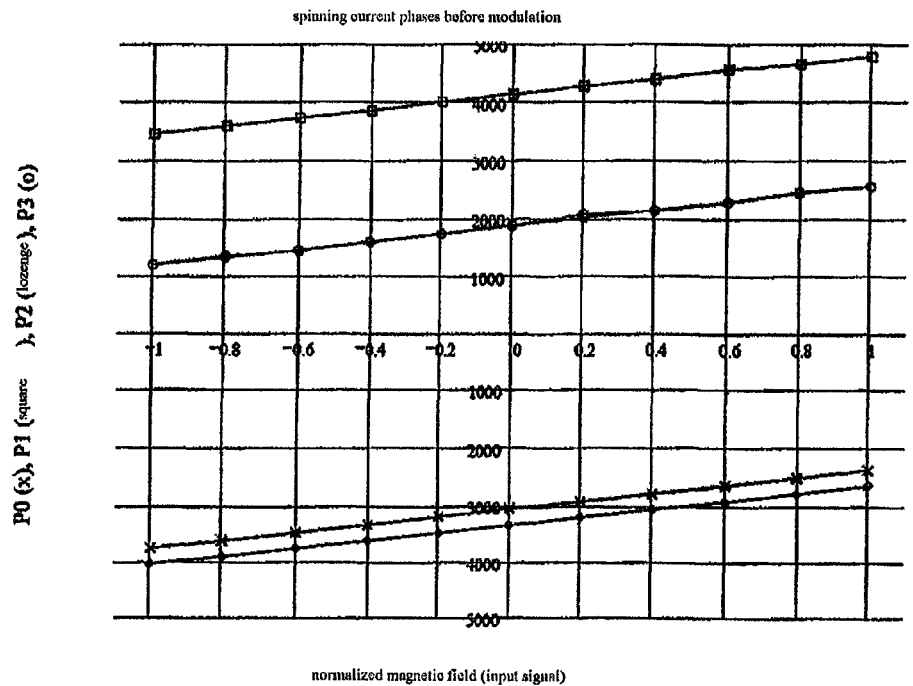
FIG. 2 shows an example of measured sensor signals of a Hall element in the four phases according to the Prior Art.
Figure 7:
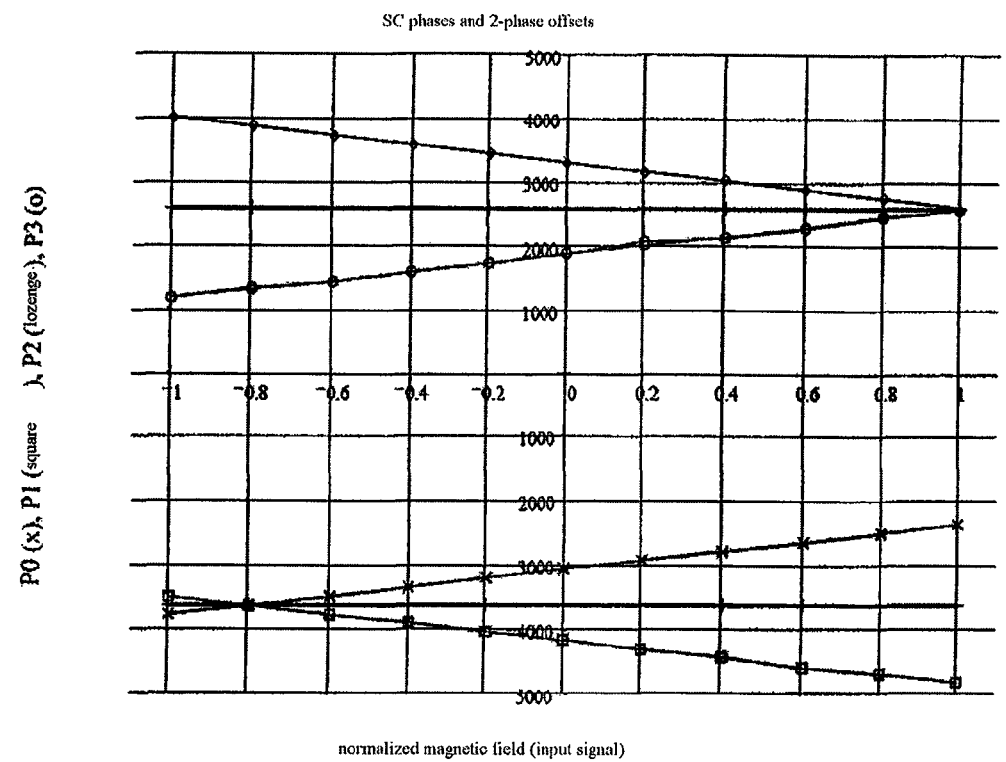
FIG. 7 shows an example of the determination of the artificial offset in the present method.
Figure 8:
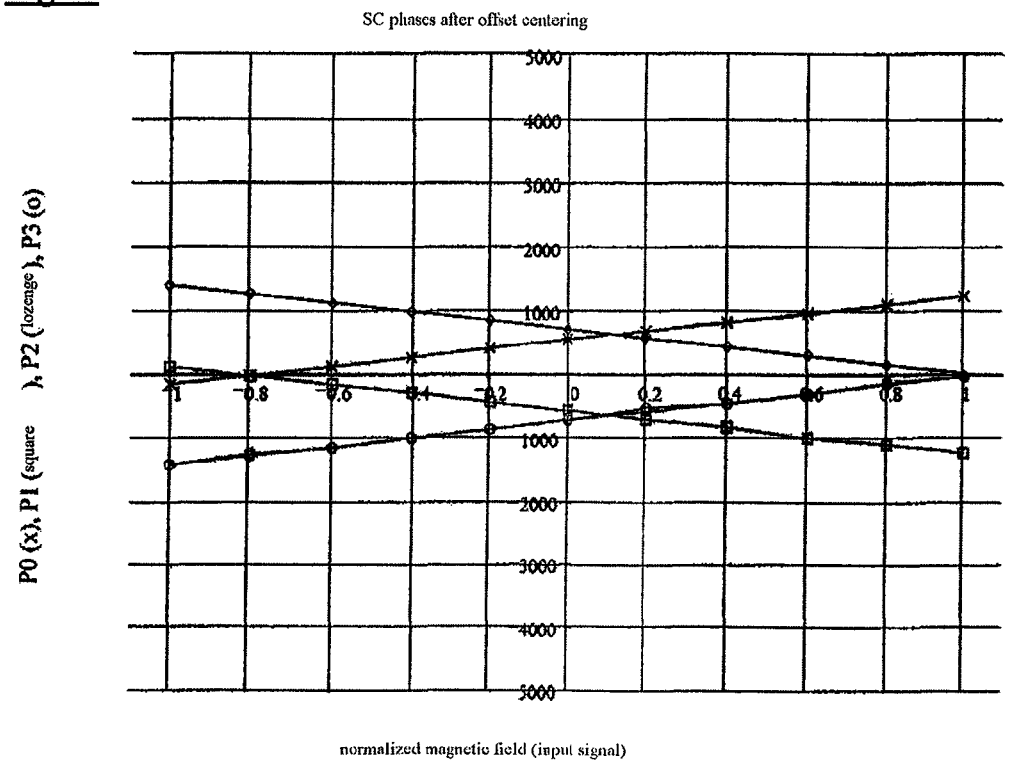
FIG. 8 shows an example of the sensor signals reduced by the artificial offset.

It is known from measurements on Hall sensors that two spinning current phases always have one single phase offset with the same mathematical sign, as is also obvious from the diagram of FIG. 2. The offset of the spinning current phases P0 and P2 has the same mathematical sign in this case. This is also true for the offset of the spinning current phases P1 and P3. The total signal range of all four individual phases covers the value range from approximately −4000 to +5000. However, because the offset is a stochastic variable which scatters from sensor to sensor, the system will be designed in such a way that the signal range of the ADU (analog/digital converter) is adapted to the maximum offset of the sensors in both directions and thus extends approximately from −5000 to +5000. This is approximately 10,000 quantification steps of the analog/digital converter. In the present method, the mean offset of the particular two phases which have the same mathematical sign after the modulation of an offset is determined and applied to these two phases before the input of the amplifier, i.e., subtracted from the measurement signals of these two phases. For this purpose, FIG. 7 shows the measurement signals of the four spinning current phases after the modulation as a function of the magnetic field and the particular calculated mean offset $O_1$ or $O_2$, respectively. If the sensor signals of the individual phases are each corrected by the shared offset $O_1$, $O_2$ for the particular two spinning current phases, as illustrated in FIG. 8, the value range for the measurements of all four spinning current phases will be reduced to the range from approximately −1800 to +1800. These are approximately 3600 quantification steps. The control range of the analog/digital converter is thus exploited symmetrically on the one hand. The offset of the spinning current phases is now symmetrical to the reference point axis, because of which the present technology may also be referred to as offset balancing. On the other hand, the amplification may now be increased in this example by the factor 10,000/3600=2.8, which also improves the resolution of the signal by the factor 2.8. This results in an increase of the resolution of the signal by at least 1.5 bits.

The correction of the offset is performed in this example using a shared correction offset for the phases P0 and P1 and a shared correction offset for the phases P2 and P3. In another Hall sensor, there may also be other combinations of the phases, of course. The modulation may also be executed differently, so that in contrast to the present example, the first phase is not weighted positively, the second phase negatively, the third phase positively, and the fourth phase negatively (or vice versa), but rather the first and fourth phases are weighted positively and the second and third phases are weighted negatively, for example.

An essential advantage of the suggested procedure is that—as already explained—the correction value no longer has to have long-term stability and may also have a certain variation over the temperature and other operating parameters. It is again systematically eliminated from the overall measured value, because it is weighted positive once and negative once when the summation, which may also be performed in the decimation filter, occurs at the end of the chain. The requirement for this is that two phases may always be corrected jointly in the offset, which are processed with different mathematical signs by the chopper arrangement. The final result of the spinning current method is then not impaired by the offset balancing. The measurement result is the same, only with the difference that the control range of the participating amplifier and the analog/digital converter is exploited better and the resolution of the measurement result is thus higher.

Figure 9:
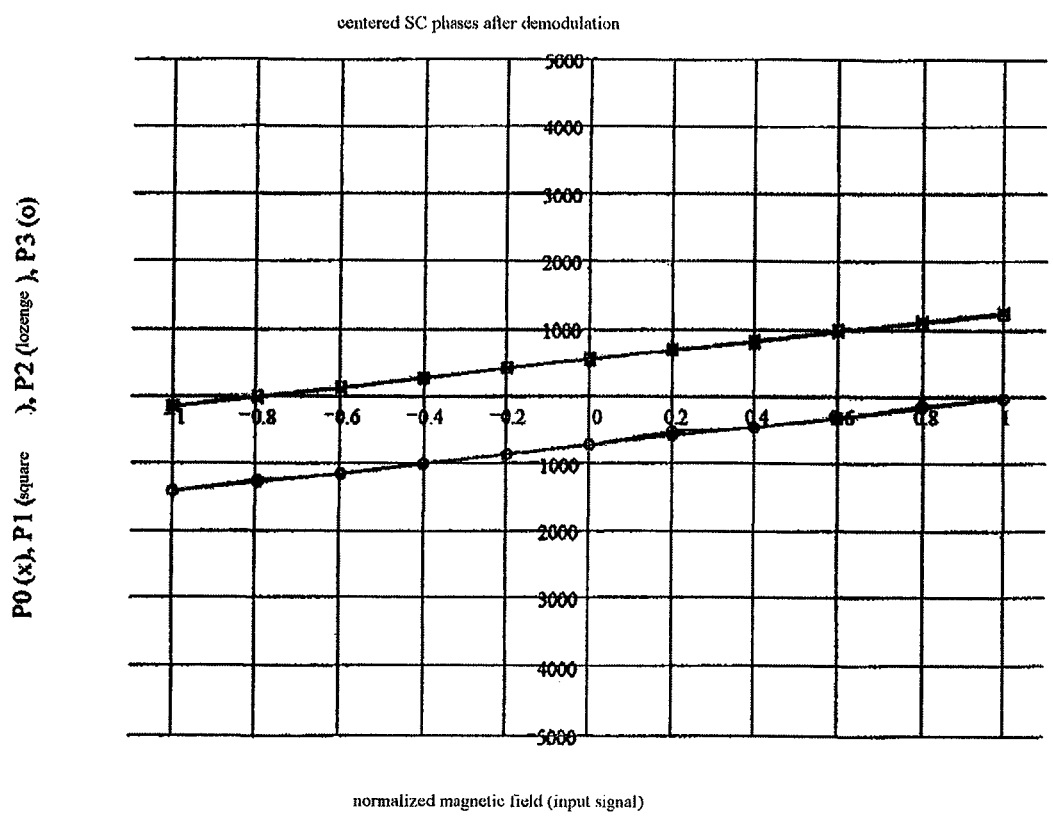
FIG. 9 shows the example of FIG. 8 after the demodulation.
Figure 10:
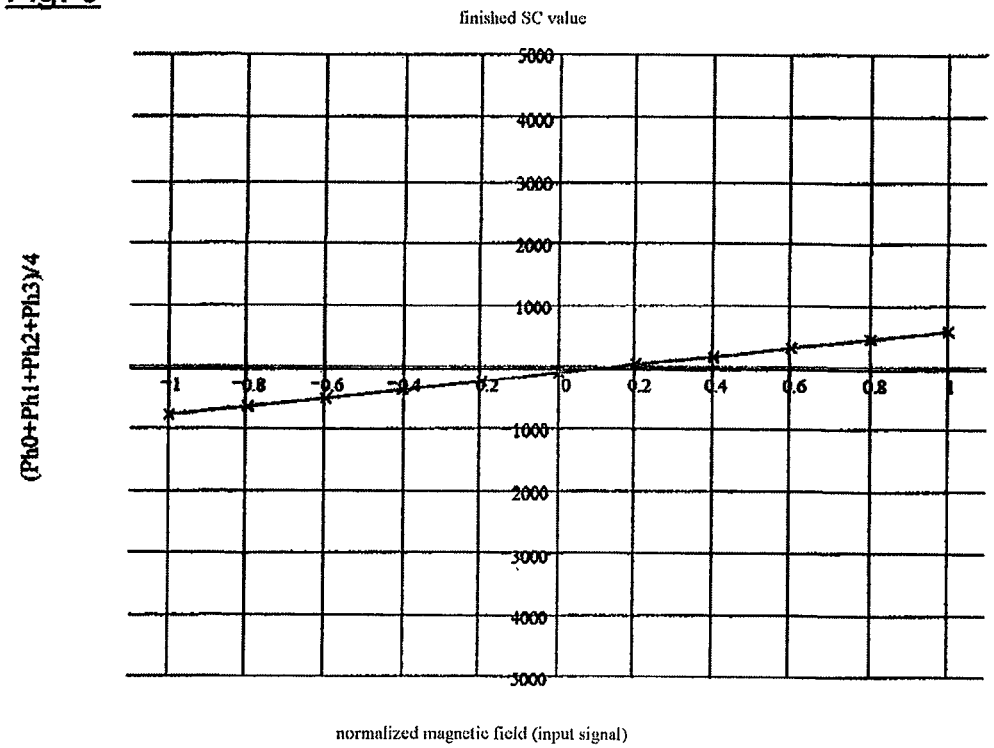
FIG. 10 shows the spinning current (SC) output value resulting in the example.

FIG. 9 shows the four spinning current phases after the offset correction and the subsequent demodulation. The output signal obtained after the spinning current method is carried out completely, i.e., after the averaging over all four phases, is shown in FIG. 10. As may be seen from the spinning current result, the control range is still strongly affected by single phase offsets. The sensor or signal without offset has a value range from approximately −700 to +700, which corresponds to a span of 1400 quantification steps. The remaining single phase offset by the offset balancing is still approximately ±1150, i.e., 2300 quantification steps. Nonetheless, the resolution and thus the measurement precision are increased in relation to the previously known methods by at least 1 bit.

Figure 11:
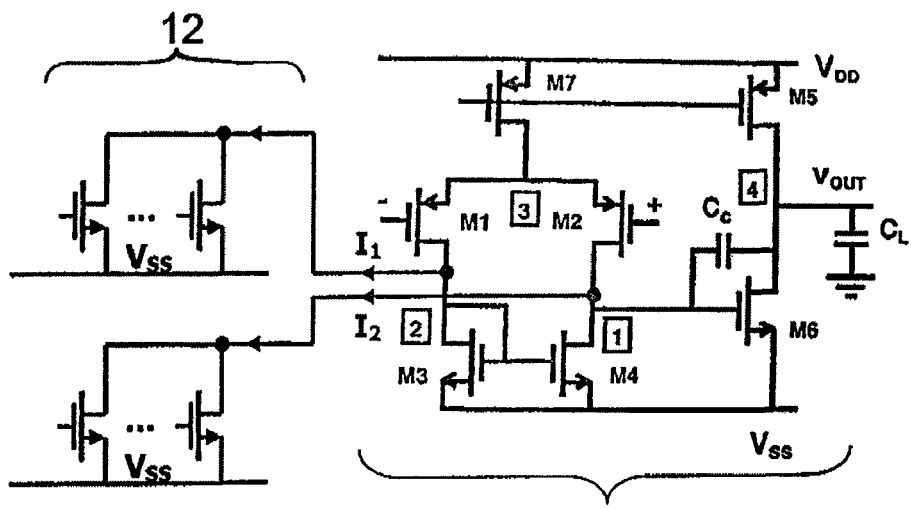
FIG. 11 shows a first example of the setting of the artificial offset which is subtracted from the sensor signals.

FIG. 11 shows an example of an implementation of the suggested offset centering upon use of a linear differential input stage as the amplifier.

In a differential input stage of a linear amplifier, the offset may be controlled via programmable current sources. These programmable current sources are indicated in the figure by the reference numeral 12. The artificial offset may be subtracted from the input signals of the linear amplifier 9 via these current sources, which are settable according to the desired artificial offset.

Figure 12:
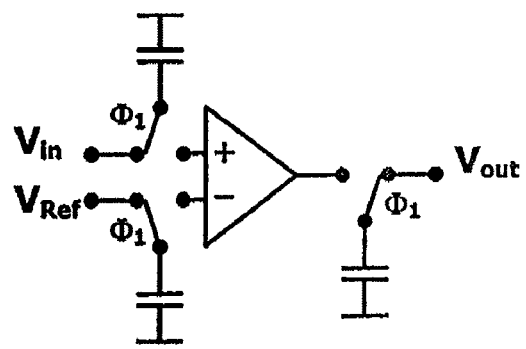
FIG. 12 shows a second example of the setting of the artificial offset which is subtracted from the sensor signals.

In SC circuits (SC: switched capacitor), the offset may also be set via a switched capacitor together with a controlled voltage source ($V_{Ref}$), as shown in FIG. 12.

Figure 13:
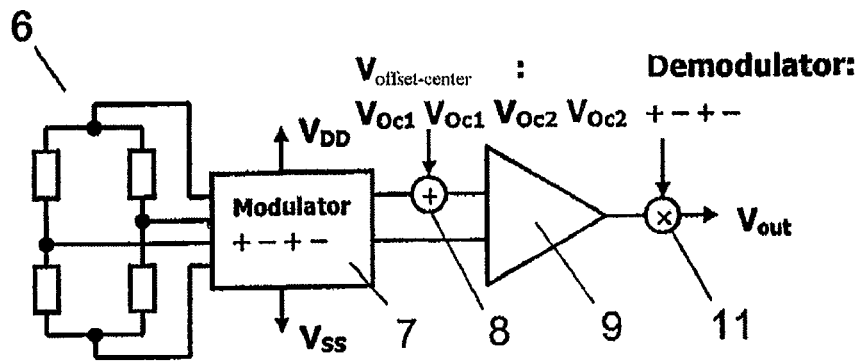
FIG. 13 shows a further example of the design of the suggested sensor arrangement.

Finally, FIG. 13 once again shows an exemplary design of the present sensor arrangement having a Hall sensor 6, a modulator 7, the offset source 8, the amplifier 9, and the demodulator 11. The ADU is not shown in this figure. The mode of operation of the present method and the effect on the signals may be reconstructed once again on the basis of FIG. 13. Before the modulator, the sensor signals of the individual phases have the values $+V_{Sig}+V_{Off0}$ (phase P0), $+V_{Sig}+V_{Off1}$ (phase P1), $+V_{Sig}+V_{Off2}$ (phase P2), and $+V_{Sig}+V_{Off3}$ (phase P3). $V_{Sig}$ corresponds to the actual useful signal, i.e., the signal ideally measured by the magnetic travel. $V_{Off}$ corresponds to the offset of the Hall sensor in the particular phase. The signals of the individual phases are then weighted with positive or negative mathematical sign in the modulator in the way arranged in the following table. After the modulator, the particular offset $V_{Oc1}$ or $V_{Oc2}$ averaged over two phases is subtracted by the offset source 8. The corresponding smaller signal before the amplifier is then amplified and demodulated again in the demodulator with the correct mathematical sign. The signals before the amplifier, the mathematical sign in the demodulator, and the output signal from the demodulator $V_{out}$ may be inferred from the table. After application of the summation of the spinning current method, the fourfold measurement signal $4 \times V_{Sig}$ then at least approximately results. Because of the properties (absolute value and mathematical sign) of the offset components $V_{Off0}$, $V_{Off1}$, $V_{Off2}$, and $V_{Off3}$, they cancel out mutually when the signals of the four spinning current phases are summed. The spinning current method for reducing the offset of Hall elements is based thereon.

TABLE 1 modulation and demodulation of all 4 phases

| | Chopper or spinning current phase | | | |
|---|---|---|---|---|
| | 0 | 1 | 2 | 3 |
| Signal before modulator | $+V_{Sig} + V_{Off0}$ | $+V_{Sig} + V_{Off1}$ | $+V_{Sig} + V_{Off2}$ | $+V_{Sig} + V_{Off3}$ |
| Mathematical sign in modulator | + | − | + | − |
| Signal after modulator | $+V_{Sig} + V_{Off0}$ | $-V_{Sig} - V_{Off1}$ | $+V_{Sig} + V_{Off2}$ | $-V_{Sig} - V_{Off3}$ |
| $V_{Offset-center}$ | $V_{Oc1}$ | $V_{Oc1}$ | $V_{Oc2}$ | $V_{Oc2}$ |
| Signal before amplifier | $V_{Oc1} + V_{Sig} + V_{Off0}$ | $V_{Oc1} - V_{Sig} - V_{Off1}$ | $V_{Oc2} + V_{Sig} + V_{Off2}$ | $V_{Oc2} - V_{Sig} - V_{Off3}$ |
| Mathematical sign in demodulator | + | − | + | − |
| $V_{Out}$ | $V_{Oc1} + V_{Sig} + V_{Off0}$ | $-V_{Oc1} + V_{Sig} + V_{Off1}$ | $V_{Oc2} + V_{Sig} + V_{Off2}$ | $-V_{Oc2} + V_{Sig} + V_{Off3}$ |
| All four phases summed | | $4^*V_{Sig} + V_{Off0} + V_{Off0} + V_{Off0} + V_{Off0} \approx 4^*V_{Sig}$ | | |

The control range of the signal chain (amplifier and ADU) is symmetrically controlled with the suggested method. The method allows the application of the amplifier to be increased, so that the signal/noise ratio is improved. In addition, the control range of the ADU is therefore better exploited and the resolution of the measurement value is thus increased. The measurement value is not corrupted, because the artificially added offset in the present method is systematically removed again on the basis of the chopper method.

The offsets of the individual phases must be measured beforehand for each sensor in the present method so that the particular mean offset for two phases having the same mathematical sign of the offset may be ascertained. However, a calibration of the system is necessary beforehand for measurements at high precision, so that the additional effort is kept within limits.

LIST OF REFERENCE NUMERALS

| | |
|---|---|
| 1 | modulator |
| 2 | amplifier |
| 3 | demodulator |
| 4 | low-pass filter |
| 5 | offset source |
| 6 | Hall sensor |
| 7 | modulator |
| 8 | offset voltage source |
| 9 | amplifier |
| 10 | analog/digital converter |
| 11 | decimation filter |
| 12 | controlled current sources |

The invention claimed is:

1. A method for processing sensor signals, which are subject to an offset, of a sensor (6), which is operated in a plurality of measurement cycles with 2n (n =1, 2, . . . ) successive phases each with different driving,
   in which the sensor signals of the individual phases are amplified in an amplifier (9) and subsequently digitized using an analog/digital converter (10), and in which the amplified digitized signals of the individual phases of each measurement cycle are summed to obtain an offset-reduced output signal for each measurement cycle,
   the sensor signals being modulated before the amplification in a modulator (1) and demodulated again after the amplification in a demodulator (3),
   characterized in that, by the modulation, the sensor signals of n phases of each measurement cycle are weighted with negative mathematical sign and the sensor signals of the remaining n phases of the measurement cycle are weighted with positive mathematical sign, and
   before the amplification of the modulated sensor signals of each two phases which were weighted with different mathematical sign and have an offset of the same mathematical sign after the modulation, an offset averaged from the sensor signals of the two phases is subtracted.

2. The method according to claim 1,
   characterized in that the demodulation is performed after the digitization.

3. The method according to claim 1 for processing sensor signals of a Hall sensor, which is operated in spinning current operation with at least 4 phases.

4. The method according to one of claims 1 through 3, characterized in that the sensor signals are additionally modulated with a second, higher frequency in the meaning of a nested chopper method after the subtraction of the mean offset in a second modulator before the amplification, which allows a reduction of a 1/f noise of the amplifier, are filtered after the amplification, and are demodulated again with a second demodulator in regard to the second frequency after the filtering.

5. A sensor arrangement having
   a sensor (6)
   an activation unit, by which the sensor is operable in a plurality of measurement cycles each having 2n (n =1, 2, . . . ) successive phases with different driving,
   a modulator (1) for modulating the sensor signals of the sensor (6),
   an amplifier (9) for amplifying the modulated sensor signals,
   an analog/digital converter (10) for digitizing the amplified sensor signals,
   and a demodulator (3) for demodulating the amplified and/or digitized sensor signals,
   characterized in that the modulator (1) is implemented in such a way that it weights the sensor signals of n phases of each measurement cycle with negative mathematical sign and the sensor signals of the remaining n phases of the measurement cycle with positive mathematical sign, and
   an offset reduction unit (8) is provided which, before the amplification of the modulated sensor signals of each two of the phases which were weighted with different mathematical sign and have an offset of the same mathematical sign after the modulation, subtracts an offset averaged from the offset of the two phases.

6. The sensor arrangement according to claim 5,
   characterized in that the sensor (6) is a Hall sensor.

7. The sensor arrangement according to claim 6,
   characterized in that the Hall sensor is a Hall sensor operable by the activation unit in spinning current operation with at least 4 phases.

8. The sensor arrangement according to one of claims 5 through 7,
   characterized in that the demodulator (3) is a decimation filter (11) which is connected downstream from the analog/digital converter (10).

* * * * *